United States Patent
Tanaka

(10) Patent No.: US 10,768,522 B2
(45) Date of Patent: Sep. 8, 2020

(54) ORIGINAL PLATE

(71) Applicant: TOSHIBA MEMORY CORPORATION, Minato-ku, Tokyo (JP)

(72) Inventor: Yumi Tanaka, Ebina Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/285,197

(22) Filed: Feb. 25, 2019

(65) Prior Publication Data
US 2020/0073228 A1 Mar. 5, 2020

(30) Foreign Application Priority Data
Aug. 30, 2018 (JP) .................. 2018-161922

(51) Int. Cl.
*G03F 1/42* (2012.01)
*G03F 1/80* (2012.01)
*C23F 1/16* (2006.01)
*G03F 7/00* (2006.01)
*G03F 9/00* (2006.01)
*H01L 21/027* (2006.01)

(52) U.S. Cl.
CPC .................. *G03F 1/42* (2013.01); *C23F 1/16* (2013.01); *G03F 1/80* (2013.01); *G03F 7/0002* (2013.01); *G03F 9/7042* (2013.01); *H01L 21/0271* (2013.01)

(58) Field of Classification Search
None
See application file for complete search history.

(56) References Cited

U.S. PATENT DOCUMENTS

| | | | | |
|---|---|---|---|---|
| 6,873,087 B1* | 3/2005 | Choi | ...................... | B82Y 10/00 310/323.17 |
| 6,916,584 B2* | 7/2005 | Sreenivasan | ........ | B29C 35/0888 264/494 |
| 6,932,934 B2* | 8/2005 | Choi | ................... | B29C 35/0888 216/11 |
| 7,070,405 B2* | 7/2006 | Sreenivasan | ........ | B29C 35/0888 425/174.4 |
| 7,077,992 B2* | 7/2006 | Sreenivasan | .......... | B81C 1/0046 264/259 |
| 7,136,150 B2* | 11/2006 | Sreenivasan | ........... | B82Y 10/00 355/75 |
| 7,157,036 B2* | 1/2007 | Choi | ...................... | B82Y 10/00 264/264 |

(Continued)

FOREIGN PATENT DOCUMENTS

| | | |
|---|---|---|
| JP | 2015-082624 A | 4/2015 |
| JP | 2015-233052 A | 12/2015 |

(Continued)

*Primary Examiner* — Timothy Kennedy
(74) *Attorney, Agent, or Firm* — Foley & Lardner LLP

(57) ABSTRACT

An original plate includes a substrate, a pattern region in which a fine pattern is disposed on the substrate, a mark region in which a mark, including an unevenness used for alignment with a transfer receiving body on the substrate, is disposed, a first film disposed in a concave portion of the mark region and having high contrast with respect to the substrate, and a second film covering the mark region and having contrast with respect to the substrate lower than that of the first film.

13 Claims, 7 Drawing Sheets

(56) References Cited

U.S. PATENT DOCUMENTS

| | | | |
|---|---|---|---|
| 7,179,396 B2* | 2/2007 | Sreenivasan | B81C 1/0046 |
| | | | 156/242 |
| 7,281,921 B2* | 10/2007 | Watts | B29C 35/0888 |
| | | | 264/40.1 |
| 7,309,225 B2* | 12/2007 | McMackin | G03F 7/0002 |
| | | | 264/1.36 |
| 7,396,475 B2* | 7/2008 | Sreenivasan | B81C 1/0046 |
| | | | 216/11 |
| 7,780,893 B2* | 8/2010 | Sreenivasan | B29C 43/003 |
| | | | 264/293 |
| 7,837,907 B2* | 11/2010 | Nimmakayala | B82Y 10/00 |
| | | | 264/39 |
| 8,961,852 B2 | 2/2015 | Selinidis | |
| 9,046,762 B2* | 6/2015 | Kusuura | B82Y 10/00 |
| 2005/0187339 A1* | 8/2005 | Xu | B82Y 10/00 |
| | | | 524/556 |
| 2008/0061214 A1* | 3/2008 | Lee | B29C 33/424 |
| | | | 249/112 |
| 2010/0092599 A1* | 4/2010 | Selinidis | B82Y 10/00 |
| | | | 425/470 |
| 2012/0269972 A1* | 10/2012 | Khusnatdinov | G03F 9/7042 |
| | | | 427/277 |
| 2018/0267400 A1 | 9/2018 | Komukai | |

FOREIGN PATENT DOCUMENTS

| | | |
|---|---|---|
| JP | 2018-014483 A | 1/2018 |
| JP | 2018-046223 A | 3/2018 |
| JP | 2018-152478 A | 9/2018 |

\* cited by examiner

ORIGINAL PLATE

CROSS-REFERENCE TO RELATED APPLICATION

This application is based upon and claims the benefit of priority from Japanese Patent Application No. 2018-161922, filed Aug. 30, 2018, the entire contents of which are incorporated herein by reference.

FIELD

Embodiments described herein relate generally to an original plate.

BACKGROUND

An imprint method is proposed as a method for forming a fine pattern in a semiconductor device manufacturing process. In the imprint method, a resist is dropped onto a film to be processed, and an original plate on which the fine pattern is formed is pressed by the resist, and the fine pattern of the original plate is transferred to the resist.

The original plate is repeatedly used while being cleaned with an acidic solution, an alkaline solution, or the like. Therefore, the original plate is required to be resistant to cleaning.

DESCRIPTION OF THE DRAWINGS

FIG. 1A is a sectional view, FIG. 1B is an enlarged sectional view, and FIG. 1C is an enlarged plan view.

DETAILED DESCRIPTION

At least one embodiment provides an original plate which is highly resistant to cleaning.

In general, according to at least one embodiment, an original plate includes a substrate, a pattern region in which a fine pattern is disposed on the substrate, a mark region in which a mark including an unevenness used for alignment with a transfer receiving body on the substrate is disposed, a first film having high contrast with respect to the substrate disposed in a concave portion of the mark region, and a second film, covering the mark region, and having contrast lower than that of the first film with respect to the substrate.

Hereinafter, the at least one embodiment will be described in detail with reference to the drawings. It should be noted that the embodiments are not limited by the following described embodiments. In addition, configuration elements in the following embodiments include those that can be easily conceived by those skilled in the art or those that are substantially the same.

By using FIG. 1A to FIG. 7F, at least one embodiment will be described.

Configuration of Template

Figure 1A:
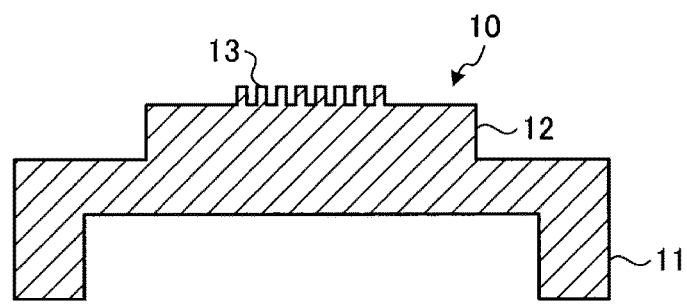
FIGS. 1A, 1B, and 1C are diagrams showing a configuration of a template according to at least one embodiment, where
Figure 1B:
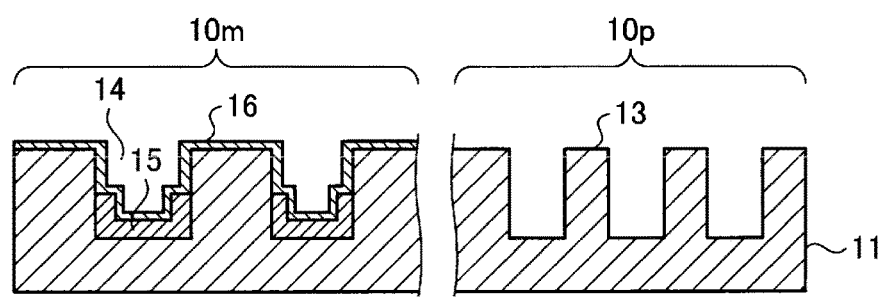
Figure 1C:
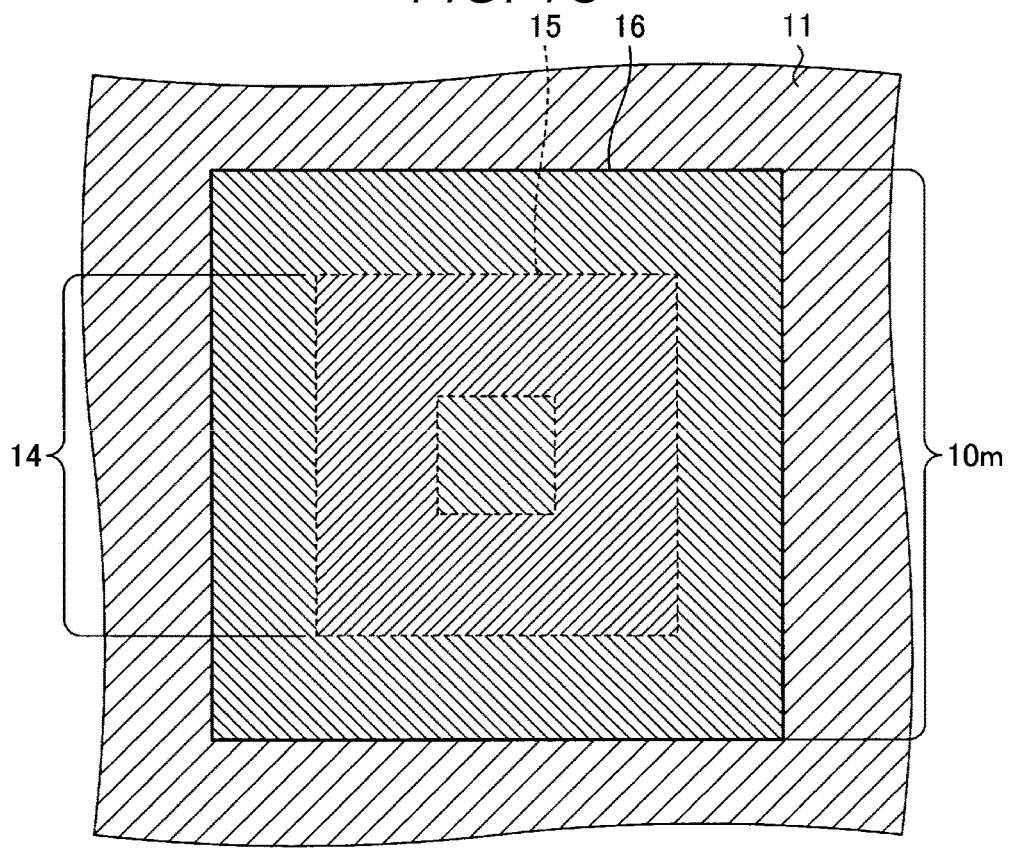

FIGS. 1A, 1B, and 1C are diagrams showing a configuration of a template 10 according to an embodiment, FIG. 1A is a sectional view, FIG. 1B is an enlarged sectional view, and FIG. 1C is an enlarged plan view.

As shown in FIG. 1A, a template 10 as an original plate includes a substrate 11 configured from a transparent member such as synthetic quartz. The substrate 11 has, for example, a rectangle shape. On one main surface of the substrate 11, a mesa portion 12 protruding from the main surface is disposed. The mesa portion 12 is also called a base portion. The mesa portion 12 is disposed, for example, at the center of the substrate 11, and has a rectangle shape. In the center of the mesa portion 12, the fine pattern 13 having fine unevenness is disposed.

As shown in FIG. 1B, more specifically, the template 10 includes a pattern region 10p on which the fine pattern 13 is disposed and a mark region 10m on which an alignment mark 14 is disposed. The template 10 is used as the original plate for forming the fine pattern on a wafer such as a semiconductor substrate. For example, the alignment mark 14 is provided at the outer peripheral portion of the pattern region 10p, and used for alignment of the wafer and the template 10. The alignment mark 14 has a concave portion and a convex portion.

On the concave portion of the alignment mark 14, a high contrast film 15, as a first film that covers the entire bottom surface and a part of the side surface of the concave portion, is formed. The high contrast film 15 is a film having high contrast with respect to the substrate 11 of the template 10 and has high reflectance with respect to, for example, light. That is, the high contrast film 15 has the high contrast with respect to the substrate 11 by having optical characteristics different from those of the substrate 11 of the template 10. More specifically, the high contrast film 15 is a film including a metal or the like. Furthermore specifically, the high contrast film 15 is configured with materials of, for example, at least one of the materials Ti, Ta, W, Cr, Cu, SiC, or $SiF_4$. That is, the high contrast film 15 may be configured with an alloy in which some of these elements are combined, or may be a film in which a plurality of films of different kinds of elements are stacked.

On the concave portion and the convex portion of the alignment mark 14, a low contrast film 16, as a second film that covers the entirety of a mark region 14m, is formed. That is, the low contrast film 16 covers the entire bottom surface and the entire side surface of the concave portion, and the entire upper surface of the convex portion. The low contrast film 16 is a film having contrast lower than that of the high contrast film 15 with respect to the substrate 11 of the template 10, and has reflectance lower than that of, for example, the high contrast film 15. In addition, it is preferable that the low contrast film 16 includes at least one of the following characteristics: acid resistance, alkali resistance, or oxidation resistance. More specifically, the low contrast film 16 is a transparent oxide film having transparency to light having a predetermined wavelength such as visible light, or the like. That is, the low contrast film 16 has the optical characteristics similar to those of the substrate 11 of the template 10. Even more specifically, for example, the low contrast film 16 is configured with at least one of the materials $SiO_2$, $Ta_2O_5$, $Al_2O_3$, $TiO_2$, $ZrO_2$, $Y_2O_3$, YAG (Y3A15O12), $HfO_2$, or $CaF_2$. That is, the low contrast film 16 may be configured with the oxide film including some of these elements or may be a film on which a plurality of oxide films of different types are stacked.

As shown in FIG. 1C, the low contrast film 16 covers the entirety of the alignment mark 14 and has a rectangle shape spreading by several μm in every direction from the alignment mark 14. The mark region 14m includes the alignment mark 14 and indicates the entire region covered by the low contrast film 16.

In addition, for example, the pattern region 10p (not shown) also has a rectangle shape. For example, the mark regions 10m are arranged at the four corners of the pattern region 10p of a rectangle shape.

Manufacturing Process of Template

Next, by using FIG. 2A to FIG. 3E, examples of a manufacturing process of the template 10 of at least one embodiment will be described. FIG. 2A to FIG. 3E, are flow diagrams showing examples of a procedure of a manufacturing process of the template 10 according to at least one embodiment.

Figure 2A:
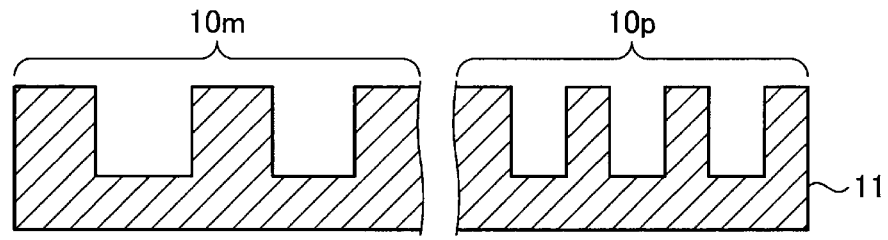
FIGS. 2A to 2F are flow diagrams showing examples of a procedure of a manufacturing process of the template according to at least one embodiment.

As shown in FIG. 2A, a substrate 11 is provided in which the unevenness is formed on each of the pattern regions 10p and the mark region 10m. Such a substrate 11 may be formed by using a master template using an inversion pattern of the unevenness in the substrate 11.

Figure 2B:
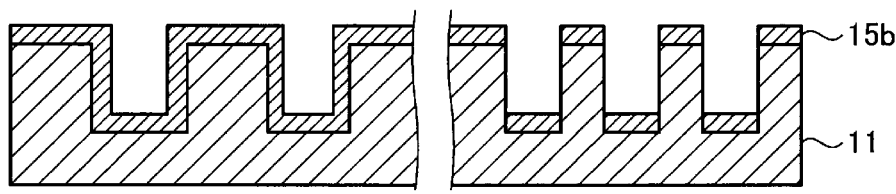

As shown in FIG. 2B, a metal film 15b such as Cr is formed to cover the entire surface of the substrate 11. The metal film 15b is formed by, for example, physical vapor deposition, chemical vapor deposition, or the like. At this time, in the mark region 10m, the metal film 15b covers the entirety of the bottom surface and the side surface of the concave portion. Meanwhile, in the pattern region 10p, the metal film 15b is formed to cover the bottom of the concave portion, and not formed on the side surface. Since an opening of the concave portion in the pattern region 10p is minute and the aspect ratio of the concave portion is high, a metal film 15b having insufficient coverage property for this cannot cover the entirety of the concave portion.

Figure 2C:
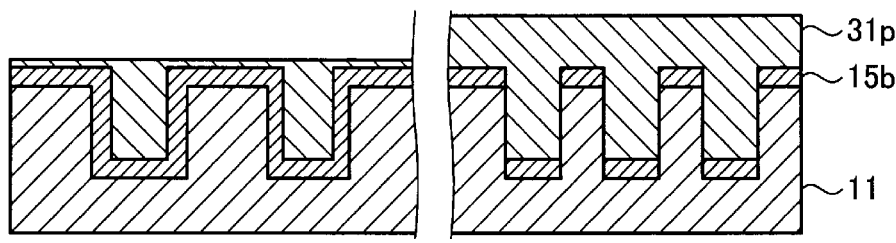

As shown in FIG. 2C, a resist pattern 31p is formed to cover the entire surface of the substrate 11. The resist pattern 31p has a thin film in the mark region 10m and is formed to have a thick film in the pattern region 10p. Such a resist pattern 31p may be formed by using a mask template having a pattern in which the unevenness is inverted from that of the resist pattern 31p.

Figure 2D:
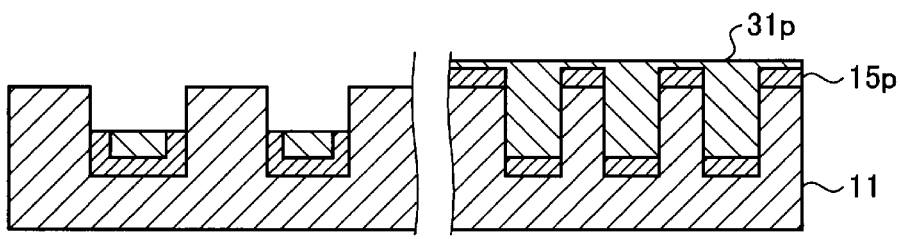

As shown in FIG. 2D, etch back of the resist pattern 31p is performed on the entire surface of the substrate 11. In the pattern region 10p, since the film thickness of the resist pattern 31p is large, the thinned resist pattern 31p remains after the etch back. In the mark region 10m, since the film thickness of the resist pattern 31p is small, the resist pattern 31p on the upper surface of the substrate 11 disappears, and then, a part of the metal film 15b is etched back. As a result, a metal film pattern 15p is formed in which the entire bottom surface and a part of the side surface of the concave portion remain.

Figure 2E:
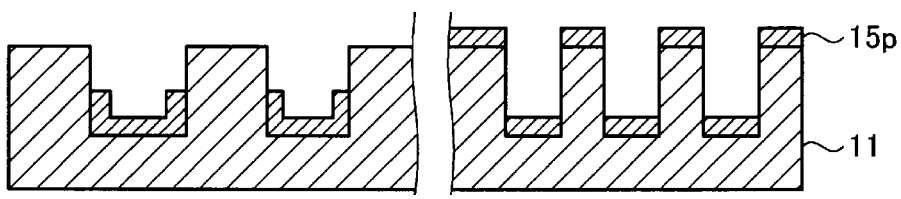

As shown in FIG. 2E, the resist patterns 31p remaining on the concave portion of the mark region 10m and the pattern region 10p, are removed. It is preferable that the resist pattern 31p is removed by wet etching using sulfated water or the like without using dry ashing or the like. This is because a metal film pattern 15p is oxidized and the optical characteristics deteriorate when using the dry ashing.

Figure 2F:
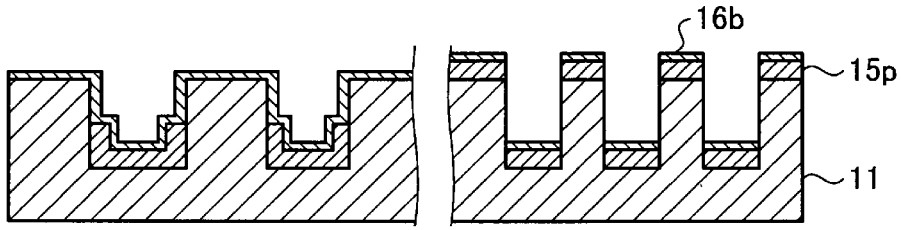

As shown in FIG. 2F, an oxide film 16b such as $Ta_2O_5$ is formed to cover the entire surface of the substrate 11. The oxide film 16b is formed by, for example, the physical vapor deposition, the chemical vapor deposition, or the like. Also, in this case, in the mark region 10m, the oxide film 16b covers the entirety of the bottom surface and the side surface of the concave portion. Meanwhile, in the pattern region 10p, the oxide film 16b is formed to cover the bottom surface of the concave portion, and is not formed on the side surface.

Figure 3A:
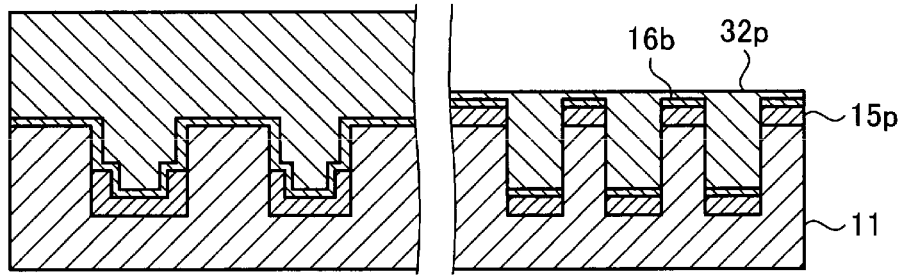
FIG. 3A to 3E are flow diagrams showing examples of another procedure of the manufacturing process of the template according to at least one embodiment.

As shown in FIG. 3A, a resist pattern 32p is formed to cover the entire surface of the substrate 11. The resist pattern 32p is formed to include the thick film in the mark region 10m, and is formed to include the thin film in the pattern region 10p.

Figure 3B:
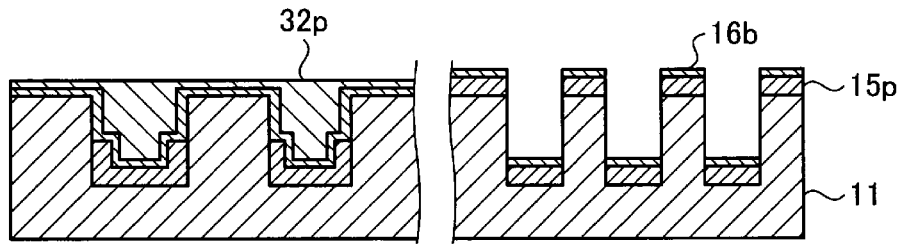

As shown in FIG. 3B, etching of the resist pattern 32p is performed on the entire surface of the substrate 11. In the mark region 10m, since the film thickness of the resist pattern 32p is large, the thickened resist pattern 32p remains after the etch back. In the pattern region 10p, since the film thickness of the resist pattern 32p is small, the oxide film 16b is exposed due to the disappearing of the resist pattern 32p.

Figure 3C:
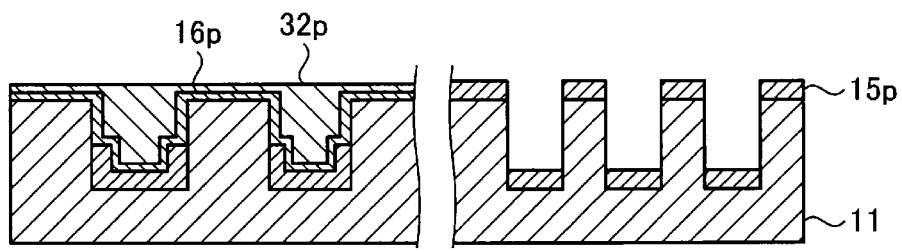

As shown in FIG. 3C, the oxide film 16b exposed in the pattern region 10p is removed by etching or the like such that the metal film pattern 15p is exposed. In the mark region 10m, the oxide film 16b is protected by the resist pattern 32p and is not removed. As a result, an oxide film pattern 16p covering the entirety of the mark region 10m is formed.

Figure 3D:
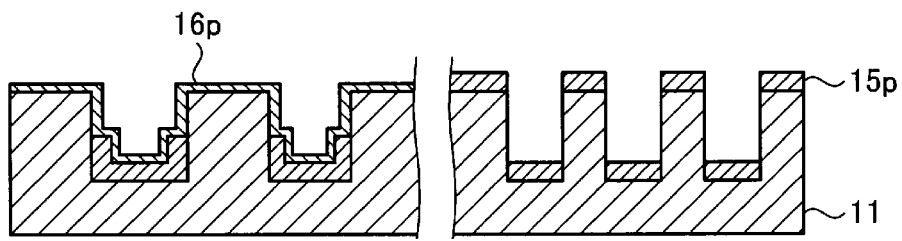

As shown in FIG. 3D, the resist pattern 32p remaining in the mark region 10m is removed by the wet etching or the like.

Figure 3E:
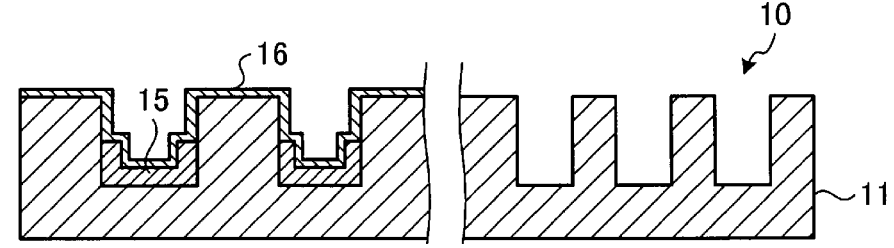

As shown in FIG. 3E, the metal film pattern 15p exposed in the pattern region 10p is removed by etching or the like. In the mark region 10m, the metal film pattern 15p is protected by the oxide film pattern 16p and not removed. As a result, the high contrast film 15 remaining in the concave portion of the mark region 10m and the low contrast film 16 remaining in the entirety of the mark region 10m are formed.

In the processes described above, the manufacturing process of the template 10 of at least one embodiment is completed.

Imprint Process by Template

Figure 4:
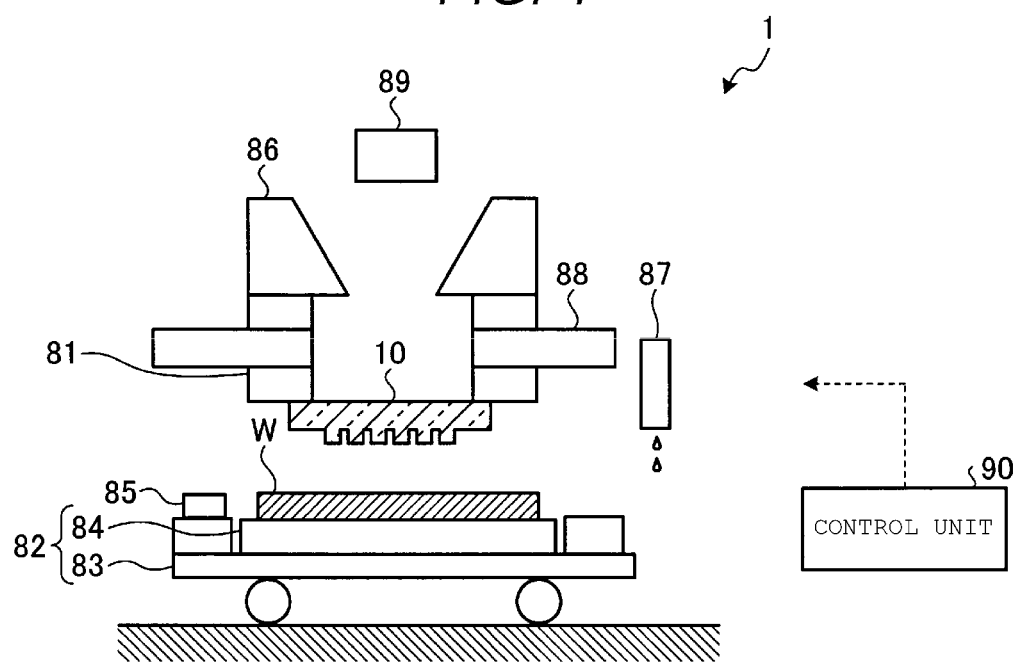
FIG. 4 is a diagram showing a configuration example of an imprint device according to at least one embodiment.

Next, as a useful example of the template 10 of at least one embodiment, an example of the imprint process using the template 10 will be described. The template 10 is used in the imprint process by being installed in the imprint device. First, a configuration example of an imprint device 1 will be described by using FIG. 4. FIG. 4 is a diagram showing a configuration example of the imprint device 1 according to the embodiment.

As shown in FIG. 4, the imprint device 1 includes a template stage 81, a mounting table 82, a reference mark 85, an alignment sensor 86, a liquid dropping device 87, a stage base 88, a light source 89, and a control unit 90. The template 10 is installed in the imprint device 1.

The mounting table 82 includes a wafer chuck 84 and a main body 83. The wafer chuck 84 fixes a wafer W which is the transfer receiving body at a predetermined position on the main body 83. The reference mark 85 is provided on the mounting table 82. The reference mark 85 is used for positioning when loading the wafer W on the mounting table 82.

The mounting table 82 holds the wafer W and is moved in a plane (horizontal plane) parallel to the placed wafer W. The mounting table 82 moves the wafer W to the lower side of the liquid dropping device 87 when a resist is applied dropwise onto the wafer W, and moves the wafer W to the lower side of the template 10 when performing a transfer process to the wafer W.

The stage base 88 presses the fine pattern 13 of the template 10 against the resist on the wafer W by supporting the template 10 by the template stage 81 and moving the template 10 in a vertical direction. The alignment sensor 86 is provided on the stage base 88. The alignment sensor 86 is a sensor for performing position detection of the wafer W and the position detection of the alignment mark 14 (see FIGS. 1A, 1B, and 1C) of the template 10.

The liquid dropping device 87 is a device for applying the resist dropwise on the wafer W by an inkjet method. An inkjet head including the liquid dropping device 87 has a plurality of fine holes for ejecting droplets of the resist, and drops droplets of the resist on the wafer W.

For example, the light source 89 is a device that irradiates ultraviolet rays, and is provided above the stage base 88. The light source 89 irradiates light from above the template 10 in a state where the template 10 is pressed against the resist.

The control unit 90 controls the template stage 81, the mounting table 82, the reference mark 85, the alignment sensor 86, the liquid dropping device 87, the stage base 88, and the light source 89.

FIGS. 5A to 5E are flow diagrams showing examples of a procedure of the imprint process by the template 10 according to at least one embodiment.

The wafer W on which the film to be processed Ox is formed, is placed on the mounting table 82, and the mounting table 82 is moved below the liquid dropping device 87.

Figure 5A:
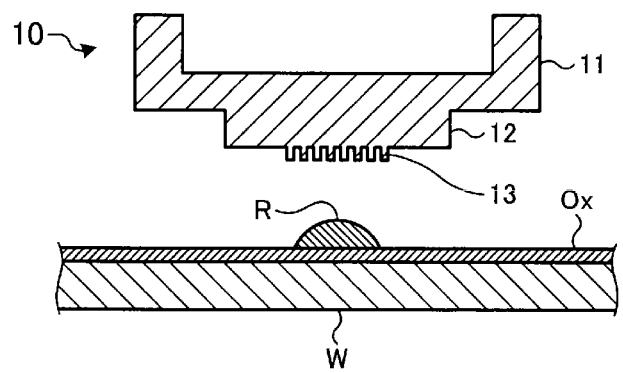
FIGS. 5A to 5E are flow diagrams showing examples of a procedure of an imprint process by the template according to at least one embodiment.

As shown in FIG. 5A, droplets of a resist R are dropped on the film to be processed Ox from the liquid dropping device 87. Then, the mounting table 82 is moved below the template 10.

Figure 5B:
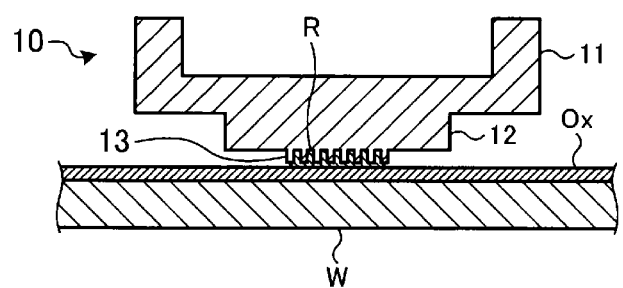

As shown in FIG. 5B, the template stage 81 is moved downward and the fine pattern 13 of the template 10 is pressed against the resist R while the alignment sensor 86 detects the alignment mark 14 (see FIGS. 1A, 1B, and 1C) and positioning is performed. Subsequently, in a state where the template 10 is pressed, light is applied from the light source 89 of the imprint device 1 to the resist R such that the resist R is cured.

Figure 5C:
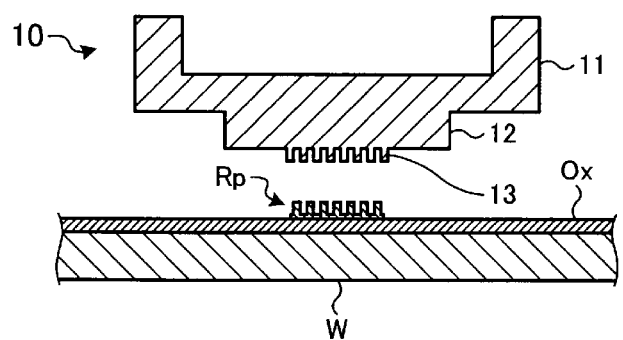

As shown in FIG. 5C, the template 10 is released. As a result, on the film to be processed Ox of the wafer W, a resist pattern Rp to which the fine pattern 13 is transferred, is formed.

Figure 5D:
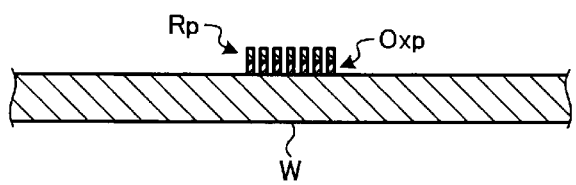

As shown in FIG. 5D, the film to be processed Ox is processed by using the resist pattern Rp, as a mask to which the fine pattern 13 is transferred. As a result, a film pattern to be processed Oxp is formed.

Figure 5E:
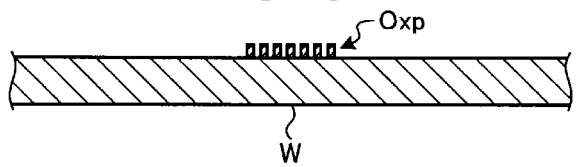

As shown in FIG. 5E, the resist pattern Rp is peeled off by ashing or the like such that the film pattern to be processed Oxp formed on the wafer W is obtained.

Since then, such a process is repeated, a semiconductor device is manufactured by forming a plurality of film patterns to be processed on the wafer W.

Although the imprint device 1 of the embodiment is configured to drop the resist R, the resist may be coated on the entire surface on the wafer W by a spin coating application method.

Since the template used in the imprint process is in contact with the resist on the wafer, the template is periodically cleaned by using an acidic solution, an alkaline solution, oxidized dry ashing, or the like. Meanwhile, the template includes an alignment mark for alignment with the wafer. The alignment mark may include a metal film or the like in order to improve the visibility. However, the acid resistance, the alkali resistance, and the oxidation resistance of a metal film are low, and it cannot withstand repeated cleaning of the template.

The template 10 of at least one embodiment includes the low contrast film 16 that covers the high contrast film 15. The low contrast film 16 has at least one of the following properties: acid resistance, the alkali resistance, or the oxidation resistance. As a result, when cleaning the template 10, it is possible to protect the high contrast film 15 which is inferior to these characteristics and it is possible to improve the resistance to the cleaning of the template 10. Therefore, it is possible to use the template 10 repeatedly, and the life of the template 10 is extended.

The template 10 of at least one embodiment includes the low contrast film 16 having the optical characteristics similar to those of the substrate 11. As a result, even if the high contrast film 15 is covered by the low contrast film 16, the visibility of the alignment mark 14 is not significantly reduced.

The template 10 of at least one embodiment includes the high contrast film 15 and the low contrast film 16 formed by the physical vapor deposition, the chemical vapor deposition, or the like. According to the above-described manufacturing process of the template 10, the substrate 11 with the resist pattern is not brought into a device in which the physical vapor deposition, the chemical vapor deposition, or the like is performed. As a result, it is possible to prevent contamination due to the resist pattern.

Modification Example

Next, by using FIG. 6 to FIG. 7E, a template 20 of a modification example of at least one embodiment will be described. The template 20 of the modification example is different from the above-described embodiments in that a low contrast film 26 is also provided in a pattern region 20p.

Figure 6:
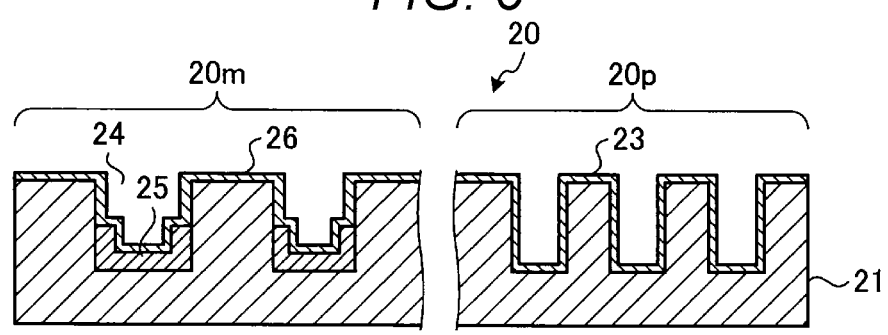
FIG. 6 is a sectional view showing a configuration of a template according to a modification example of at least one embodiment.

FIG. 6 is a sectional view showing a configuration of the template 20 according to the modification example of at least one embodiment.

As shown in FIG. 6, the template 20 as the original plate includes the pattern region 20p in which a fine pattern 23 is disposed and a mark region 20m in which an alignment mark 24 is disposed.

In the concave portion of the alignment mark 24, a high contrast film 25 that covers the entire bottom and a part of the side surface of the concave portion, is formed. The high contrast film 25 is configured with at least one of, for example, the materials Ti, Ta, W, Cr, Cu, Sic, or $SiF_4$.

In the concave portion and the convex portion of the alignment mark 24, the low contrast film 26 that covers the entirety of the mark region 24m, is formed. That is, the low contrast film 26 covers the entire bottom surface and the entire side surface of the concave portion and the entire upper surface of the convex portion. The low contrast film 26 is also formed in the concave portion and the convex portion of a pattern region 24p by having it cover the entirety of the pattern region 24p. That is, the low contrast film 26 covers the entire bottom surface and the entire side surface of the concave portion, and the entire upper surface of the convex portion in the pattern region 24p. The low contrast film 26 is configured with at least one of, for example, the materials $SiO_2$, $Ta_2O_5$, $Al_2O_3$, $TiO_2$, $ZrO_2$, $Y_2O_3$, YAG, $HfO_2$, or $CaF_2$.

FIGS. 7A to 7F are flow diagrams showing examples of a procedure of a manufacturing process of the template 20 according to the modification example of at least one embodiment.

Figure 7A:
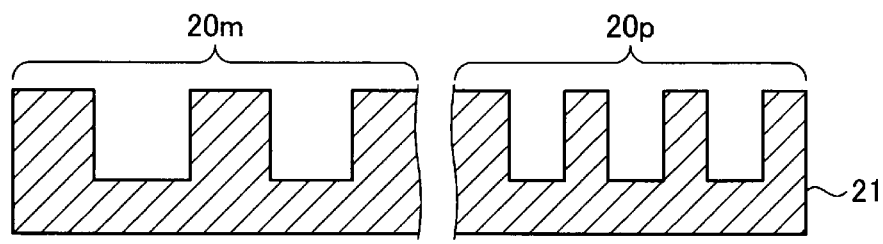
FIGS. 7A to 7F are flow diagrams showing examples of a procedure of a manufacturing process of the template according to the modification example of at least one embodiment.

As shown in FIG. 7A, a substrate 21 including the pattern region 20p and the mark region 20m on which the unevenness is formed, is provided.

Figure 7B:
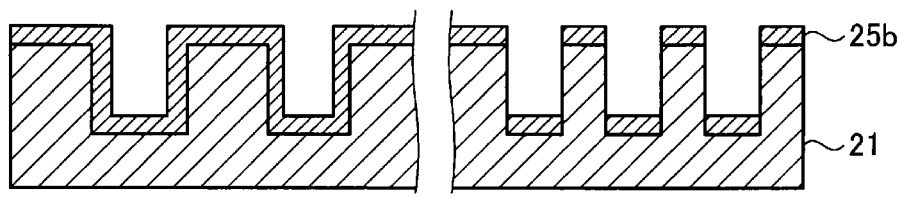

As shown in FIG. 7B, a metal film 25b such as Cr is formed by the physical vapor deposition, the chemical vapor deposition, or the like to cover the entire surface of the substrate 21. At this time, in the mark region 20m, the metal film 25b covers the entirety of the bottom surface and the side surface of the concave portion. Meanwhile, in the pattern region 20p, the metal film 25b covers the bottom surface of the concave portion and is not formed on the side surface.

Figure 7C:
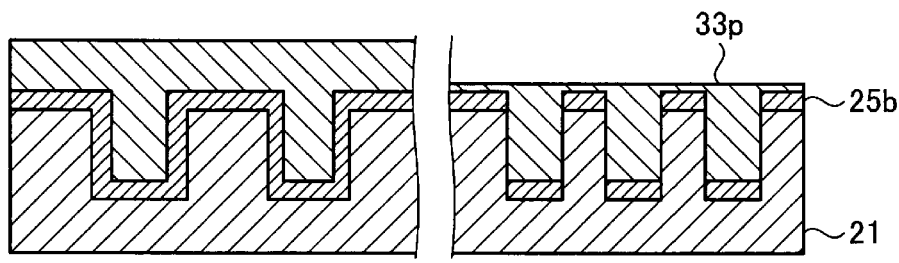

As shown in FIG. 7C, a resist pattern 33p is formed to cover the entire surface of the substrate 21. The resist pattern 33p is formed to include the thick film in the mark region 20m and to include the thin film in the pattern region 20p.

Figure 7D:
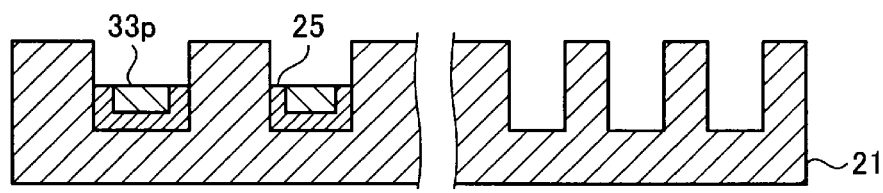

As shown in FIG. 7D, etching of the resist pattern 33p is performed on the entire surface of the substrate 21. In the mark region 20m, etching is continued until the resist pattern 33p on the upper surface of the substrate 21 disappears, and a part of the metal film 25b disappears. Meanwhile, in the pattern region 20p, since the film thickness of the resist pattern 33p is small, both the resist pattern 33p and the metal film 25b disappear. As a result, the high contrast film 25 is formed in the concave portion of the mark region 20m.

Figure 7E:
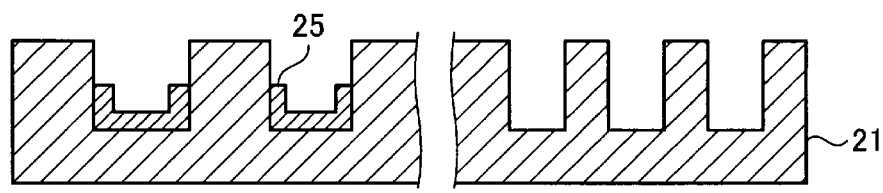

As shown in FIG. 7E, the resist pattern 33p remaining in the concave portion of the mark region 20m is removed by the wet etching or the like.

Figure 7F:
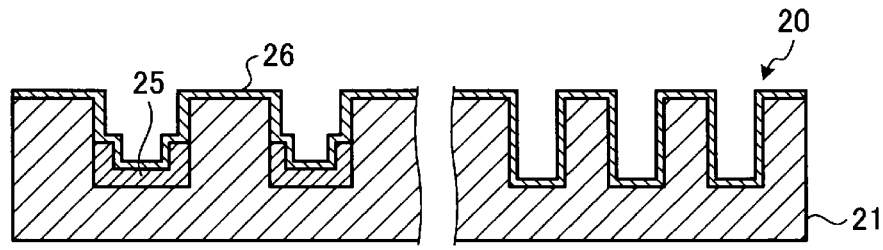

As shown in FIG. 7F, the oxide film such as $Ta_2O_5$ is formed by the physical vapor deposition, the chemical vapor deposition, or the like so as to cover the entire surface of the substrate 21. At this time, under a condition with high coverage property, it is possible to form the low contrast film 26 that covers the entirety of the bottom surface and the side surface of the concave portion not only in the mark region 20m but also in the pattern region 20p.

As described above, the manufacturing process of the template 20 of the modification example of at least one embodiment is completed.

Even in the template 20 of the modification example of at least one embodiment, the same effect as that of the template 10 of at least one embodiment is exerted.

In addition, the template 20 of the modification example of at least one embodiment includes the low contrast film 26 that covers not only the mark region 20m but also the pattern region 20p. As a result, the resistance to the cleaning of the template 20 is further improved. In addition, it is possible to prevent damage or the like of the fine pattern 23 of the template 20 during the imprint process.

In at least one embodiment and the modification example, although the templates 10 and 20 used in the imprint device 1 are described as examples, the alignment mark including a high contrast film covered with the low contrast film is widely applicable to an original plate of another optical system device such as a reticle of an exposure device.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An original plate comprising:
a substrate;
a pattern region in which a first pattern is disposed on the substrate, the first pattern includes a first bottom surface, a first side surface and a first top surface;
a mark region in which a second pattern is disposed on the substrate, the second pattern includes a second bottom surface, a second side surface and a second top surface;
a first film provided on the second bottom surface of the second pattern and having high contrast with respect to the substrate; and
a second film provided on the first film and the second side surface of the second pattern and having a contrast with respect to the substrate lower than that of the first film, wherein the second film contacts the second side surface.

2. The original plate according to claim 1,
wherein the second film has at least one of the following properties: acid resistance, alkali resistance, or oxidation resistance.

3. The original plate according to claim 1,
wherein the second film has at least one of the following properties: acid resistance, alkali resistance, or oxidation resistance.

4. The original plate according to claim 1,
wherein the first film comprises at least one of the materials Ti, Ta, W, Cr, Cu, SiC, or $SiF_4$, and
the second film comprises at least one of the materials $SiO_2$, $Ta_2O_5$, $Al_2O_3$, $TiO_2$, $ZrO_2$, $O_3$, YAG, $HfO_2$, or $CaF_2$.

5. The original plate according to claim 1, wherein the mark region is provided within an outer peripheral portion of the pattern region.

6. The original plate according to claim 1, wherein the first film includes a metal.

7. The original plate according to claim 1, wherein the second film is transparent to light.

8. The original plate according to claim 7, wherein the second film is an oxide.

9. The original plate according to claim 1, wherein the original plate is included in an imprint device.

10. The original plate according to claim 9, further comprises:
an alignment sensor configured to detect the position of the mark.

11. The original plate according to claim 1, wherein the second film is provided on the second top surface.

12. The original plate according to claim 1, wherein the second film is provided on the first bottom surface, the first side surface and the first top surface.

13. An original plate comprising:
a substrate;
a pattern region in which a first pattern is disposed on the substrate, the first pattern includes a first bottom surface, a first side surface and a first top surface;
a mark region in which a second pattern is disposed on the substrate, the second pattern includes a second bottom surface, a second side surface and a second top surface;
a first film provided on the second bottom surface of the second pattern, the first film comprising at least one of the materials Ti, Ta, W, Cr, Cu, SiC, or $SiF_4$; and
a second film provided on the first film and the second side surface of the second pattern the second film comprising at least one of the materials $SiO_2$, $Ta_2O_5$, $Al_2O_3$, $TiO_2$, $ZrO_2$, $Y_2O_3$, YAG, $HfO_2$, or $CaF_2$.

* * * * *